(12) United States Patent
Hisamatsu et al.

(10) Patent No.: US 10,886,136 B2
(45) Date of Patent: Jan. 5, 2021

(54) METHOD FOR PROCESSING SUBSTRATES

(71) Applicant: Tokyo Electron Limited, Tokyo (JP)

(72) Inventors: Toru Hisamatsu, Miyagi (JP);
Masanobu Honda, Miyagi (JP);
Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/262,994

(22) Filed: Jan. 31, 2019

(65) Prior Publication Data

US 2020/0251344 A1  Aug. 6, 2020

(51) Int. Cl.
*H01L 21/311* (2006.01)
*H01L 21/027* (2006.01)
*H01L 21/033* (2006.01)
*H01L 21/3065* (2006.01)
*H01L 21/67* (2006.01)
*H01L 21/02* (2006.01)

(52) U.S. Cl.
CPC .... *H01L 21/31116* (2013.01); *H01L 21/0228* (2013.01); *H01L 21/0273* (2013.01); *H01L 21/0337* (2013.01); *H01L 21/3065* (2013.01); *H01L 21/67069* (2013.01)

(58) Field of Classification Search
CPC .......... H01L 21/31116; H01L 21/0273; H01L 21/0337; H01L 21/3065; H01L 21/67069; H01L 21/0228
See application file for complete search history.

(56) References Cited

U.S. PATENT DOCUMENTS

| | | | | |
|---|---|---|---|---|
| 5,445,988 | A | * | 8/1995 | Schwalke ............. H01L 21/743 257/E21.538 |
| 2005/0136682 | A1 | * | 6/2005 | Hudson ............. H01L 21/31116 438/714 |
| 2007/0026677 | A1 | * | 2/2007 | Ji ......................... H01L 21/0337 438/689 |
| 2008/0029483 | A1 | * | 2/2008 | Ventzek ............... H01J 37/3233 216/58 |
| 2017/0154784 | A1 | * | 6/2017 | Wada ................. H01L 21/31116 |
| 2018/0151333 | A1 | | 5/2018 | Katsunuma |
| 2018/0190503 | A1 | | 7/2018 | Wise et al. |
| 2018/0233357 | A1 | | 8/2018 | Kabansky et al. |

\* cited by examiner

*Primary Examiner* — Duy Vu N Deo
*Assistant Examiner* — Mahmoud Dahimene
(74) *Attorney, Agent, or Firm* — Xsensus LLP

(57) ABSTRACT

A method for processing a substrate in a plasma chamber is provided. The method includes providing a substrate on which an underlying layer to be etched and a mask are formed. The method further includes forming a protective film on the mask. The method further includes performing an anisotropic deposition to selectively form a deposition layer on a top portion of the mask.

14 Claims, 11 Drawing Sheets

FIG.4

| SCHEMATIC IMAGE | INITIAL | CH₄/N₂:60s<br>BALANCE STATE OF DEPO AND ETCH | N₂:60s<br>Etch | CH₄:20s<br>Depo |
|---|---|---|---|---|
| CD (nm) | 30.8nm | 30.5nm | -- | 28.2nm |
| PR HEIGHT (nm) | 35.6nm | 34.4nm | -- | 40.2nm |

FIG.5

| | INITIAL | EXAMPLE 1 | EXAMPLE 2 | EXAMPLE 3 |
|---|---|---|---|---|
| Hole (1x8) Center | | | | |
| PR Height (nm) | 39.7 | 30.6 | 45.9 | 64.6 |
| Space | 153.7 | 155.0 | 153.7 | 155.0 |
| Hole (1x8) Center | | | | |
| X&Y CD (nm) | 22.7 / 155.6 | 21.6 / 154.2 | 19.2 / 153.2 | 19.0 / 154.6 |
| LWR 3-s | 1.70 | 1.60 | 1.48 | 1.38 |
| X&Y CD bias | - | 1.1 / -1.5 | -3.6 / -2.4 | -3.7 / -1.0 |

| 60+40M | INITIAL | 1.300+100W | 2.00(pulse)+200W | 3.300+200W |
|---|---|---|---|---|
| (1) | | | | |
| [OVAL] X/Y/XY RATIO | 27.1nm/158.6nm | 13.8nm/145.4nm /1.01 | Mask clogging | Not open |
| (2) | | | | |
| [OVAL] X/Y/XY RATIO | 27.1nm /158.6nm/··· | 21.6nm/153.0nm /1.00 | 20.6nm/155.4nm /2.03 | 21.2nm/157.4nm /4.92 |

METHOD FOR PROCESSING SUBSTRATES

FIELD

An exemplary embodiment disclosed herein relates to a method and apparatus for processing substrates.

BACKGROUND

In recent years, various mask patterning techniques have come into focus as the scaling continuously increases. Double and quadruple patterning are among these. On the other hand, extreme ultraviolet lithography (EUVL) and patterning have been widely researched. When tight pitches for one-dimensional (1D) layout patterns are achieved through EUV lithography, highly precise critical dimension (CD) control is required in a subsequent etching process; such as, atomic scale X-Y CD controllability and reduction of local variability such as Line Edge Roughness (LER), Line Width Roughness (LWR), and Local Critical Dimension Uniformity (LCDU).

For example, methods and apparatus to smooth the edges of features patterned using EUVL have been proposed (see United States Patent Application 2018/0190503 A1, for example). Meanwhile, other techniques have been proposed to reduce mask loss during etching of high aspect ratio holes (see United States Patent Application 2018/0233357 A1, for example).

SUMMARY

According to one embodiment, method for processing a substrate in a plasma chamber, includes: providing a substrate on which an underlying layer to be etched and a mask are formed; forming a protective film on the mask; and performing an anisotropic deposition to selectively form a deposition layer on a top portion of the mask.

According to one embodiment, a method for processing a substrate in a plasma chamber, includes: providing a substrate on which an underlying layer to be etched and a mask are formed; exposing the substrate with a plasma generated from a process gas containing $C_xH_yF_z$ and at least one of $N_2$, $O_2$, $H_2$, and F by a predetermined rate. In $C_xH_yF_z$, (i) x is a natural number not less than one, y is a natural number not less than one, and z is zero or a natural number not less than one, or (ii) x is a natural number not less than one, y is zero or a natural number not less than one, and z is a natural number not less than one According to one embodiment, a method for processing a substrate in a plasma chamber, includes: providing a substrate on which an underlying layer to be etched and a mask are formed; exposing the substrate to a plasma generated from a process gas containing $C_xH_yF_z$, and at least one of $N_2$, $O_2$, $H_2$, and F by a predetermined rate; forming a protective film on the mask; performing an anisotropic deposition to selectively form a deposition layer on a top portion of the mask. In $C_xH_yF_z$, (i) x is a natural number not less than one, y is a natural number not less than one, and z is zero or a natural number not less than one, or (ii) x is a natural number not less than one, y is zero or a natural number not less than one, and z is a natural number not less than one.

BRIEF DESCRIPTION OF DRAWINGS

A more complete appreciation of the present application and many of the attendant advantages thereof will be readily obtained as the same becomes better understood by reference to the following detailed description when considered in connection with the accompanying drawings, wherein:

FIG. 4 is a diagram for explaining anisotropic deposition according to one embodiment;

FIG. 5 shows a result of an experiment according to one embodiment;

DESCRIPTION OF EMBODIMENTS

An exemplary embodiment of a method and apparatus for processing a substrate disclosed in the present application will be described below in detail with reference to the accompanying drawings. The illustrative embodiment disclosed below is not intended to be limiting in any ways.

As stated above, pattern roughness has been one major problem in advanced lithography for semiconductor manufacturing. Various efforts have been made to reduce roughness of post-lithography and post-etch features. However, to improve LCDU while maintaining a desirable CD is not easy.

Process According to One Embodiment

Figure 1:
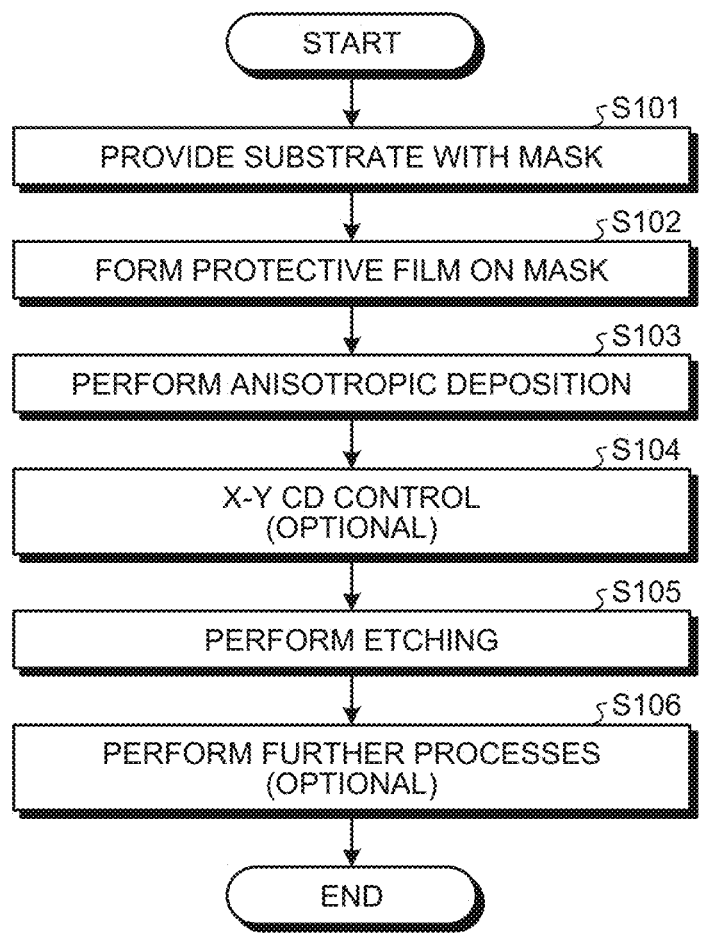
FIG. 1 is a flowchart of an exemplary process for processing a substrate according to one embodiment.

A process according to one embodiment described below realizes improvement in LCDU and X-Y CD controllability. FIG. 1 is a flowchart of an exemplary process for processing a substrate according to one embodiment. FIGS. 2A to 2D are schematic diagrams for explaining an exemplary process for processing a substrate according to one embodiment.

Figures 2A, 2B, 2C, 2D:
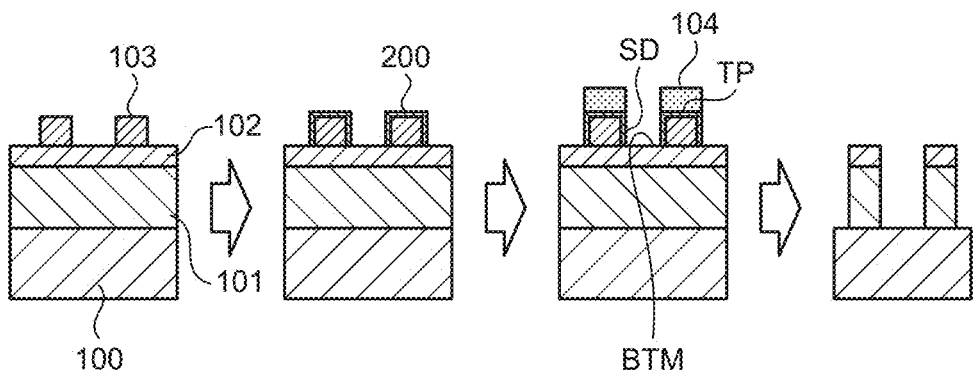
FIGS. 2A to 2D are schematic diagrams for explaining an exemplary process for manufacturing a semiconductor device according to one embodiment.

Firstly, a substrate 100 is provided (step S101, FIG. 2A). On the substrate 100, various layers are formed, including, for example, an underlying layer 101, i.e., a layer to be etched, an antireflection coating 102, and a mask 103 in this order (see FIG. 2A). The mask 103 may be formed via EUVL and may have a predetermined pattern. Then, on the mask 103, a protective film 200 is formed (step S102, FIG.

2B). From above the protective film 200, anisotropic deposition is performed (step S103, FIG. 2C). Process condition of the anisotropic deposition in step S103 is set such that a layer 104 of deposits is formed selectively on a top portion TP of the mask 103. For example, the layer 104 is formed substantially only on the top portion TP of the mask 103 but not on a bottom portion BTM and/or a sidewall portion SD of the pattern on the substrate 100. Thus, the anisotropic deposition of step S103 serves to substantially increase the thickness of the mask 103 with the layer 104. Optionally, X-Y CD control may be performed (step S104). For the X-Y CD control, re-deposition described later may be used. After step 104, etching is performed to etch the underlying layer 101 (step S105, FIG. 2D). Optionally, further processes may be performed (step S106). Thus, the process according to one embodiment ends.

Here, the substrate 100 may be a silicon (Si) substrate.

The underlying layer 101 may include more than one layer. The underlying layer 101 may include oxides, metals (e.g., hafnium, cobalt, tungsten, titanium) or metal oxides, conductive films (e.g., titanium silicide, titanium nitride, cobalt silicide), dielectric materials (e.g., silicon oxide, silicon nitride, spin-on-glass (SOG)), hardmask materials (e.g., amorphous carbon, amorphous silicon), or others.

The anti-reflection coating 102 may be silicon-containing anti-reflection coating (SiARC) or nitrogen-free anti-reflective layer (NFARL). The underlying layer 101 may include a spin-on carbon (SOC) layer.

The mask 103 may be a mask of an organic material, such as photoresist. The mask 103 may be an organic photoresist mask formed by EUV lithography. The mask 103 may include metal such as Tungsten (W) or Titanium (Ti).

The protective film 200 may be an inorganic film. The protective film 200 may include silicon. The protective film 200 may include $SiO_x$ or $SiN_x$. The protective film 200 may include metal. The protective film 200 may be formed by direct current superposition (DOS) which is described later, chemical vapor deposition (CVD), physical vapor deposition (PVD), or ALD. In the above description, the protective film 200 is described as a layer of deposits. Optionally, the protective film 200 may be a surface of the mask 103a. In this case, the surface of the mask 103a is cured by the DOS with a process gas such as Argon gas so as to serve as the protective film 200. The protective film 200 has a thickness of at least one atomic layer. For example, the protective film 200 may be one to two nanometers in thickness.

The layer 104 may include carbon.

Technique to achieve deposition is not particularly limited. For example, CVD, PVD, ALD and other techniques can be used for deposition. Similarly, etching can be realized by dry etching and atomic layer etching (ALE), for example. In the anisotropic deposition of step S103, a process gas containing $C_xH_y$ and at least one of $N_2$, $O_2$, $H_2$ and F may be used. For example, a process gas containing methane ($CH_4$) and nitrogen ($N_2$) may be used. Preferably, the process gas does not contain fluoride (F). In other words, the process gas may contain $C_xH_yF_z$, where (i) x is a natural number not less than one, y is a natural number not less than one, and z is zero or a natural number not less than one, or (ii) x is a natural number not less than one, y is zero or a natural number not less than one, and z is a natural number not less than one. In one embodiment, each process may be performed in the same plasma chamber or in the same system or may be performed in a different chamber or in a different system.

In FIG. 1, the CD control is described as being performed after the anisotropic deposition (S103). However, a process for X-Y CD control may be performed before the anisotropic deposition (S103), or before the protective film 200 is formed (S102). For example, a balanced plasma process described later may be performed before the protective film 200 is formed.

Anisotropic Deposition

In the process of FIG. 1, the anisotropic deposition is performed in step S103. Details of the anisotropic deposition will be described below.

Here, the anisotropic deposition refers to a deposition process in which the deposits form a layer substantially only on a surface of a pattern extending in one direction and not on a surface extending in another direction. In one embodiment, the layer of deposits is formed substantially only on a top portion of the pattern on the substrate and not on a bottom portion or a sidewall portion of the pattern. The anisotropic deposition can be achieved through the adjustment of various process conditions. In this embodiment, the anisotropic deposition is realized by taking a balance between deposition and etching.

Figure 3:
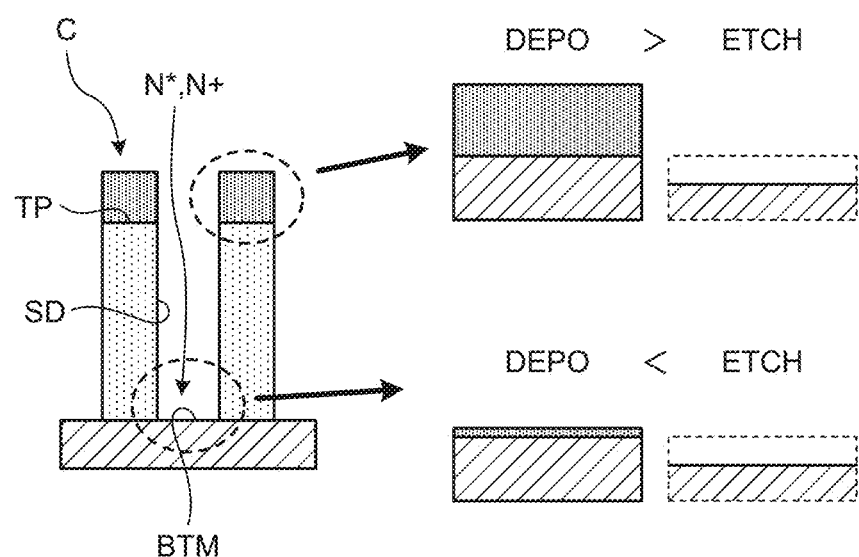
FIG. 3 illustrates a mechanism of anisotropic deposition according to one embodiment.

FIG. 3 illustrates a mechanism of anisotropic deposition according to one embodiment. In an example of FIG. 3, a pattern including a top portion TP, sidewall portion SD, and bottom portion BTM is formed on a substrate. When a deposition process is performed on the pattern, the deposits may form a thicker layer on the top portion TP than on the bottom portion BTM or the sidewall portion SD due to loading effect, for example. Meanwhile, when an etching process is performed on the pattern, the amount to be etched may be the same on the top portion IP and the bottom portion BTM. As a result, if different gases, one serves to form deposits on the pattern, such as a carbon gas (C), and another serves to etch the pattern, such as a nitrogen gas (N*, N+), are supplied to the substrate at the same time for a plasma process, the etching and the deposition may offset with each other at the bottom portion BTM, while the deposition may be more prominent than the etching at the top portion TP. In the case of FIG. 3, a layer of deposits may be formed only on the top portion TP.

FIG. 4 is a diagram for explaining anisotropic deposition according to one embodiment.

In FIG. 4, "INITIAL" depicts a vertical section of a photoresist mask after the development as an initial state; "$CH_4/N_2$: 60 s" indicates a condition of the photoresist mask after the anisotropic deposition was performed for 60 seconds using a process gas containing $CH_4$ and $N_2$; "$N_2$: 60 s" indicates a condition of the photoresist mask treated with $N_2$ gas for 60 seconds; and "$CH_4$: 20 s" indicates a condition of the photoresist mask treated with $CH_4$ gas for 20 seconds.

As illustrated in FIG. 4, when the $CH_4$ gas (mainly for deposition) and $N_2$ gas (mainly for etching) were employed in the anisotropic deposition for 60 seconds, both the CD and the height of the mask did not change significantly from the size observed in the initial state. On the other hand, when only the $N_2$ gas was employed for 60 seconds, the mask was substantially removed. Further, when only the $CH_4$ gas was employed for 20 seconds, though the height of the mask increased from 35.6 nm to 40.2 nm, overall shape of the mask was distorted and the CD decreased from 30.8 nm to 28.2 nm. Thus, it can be said, by performing both deposition and etching in one step using a balanced condition, desirable CD and mask height may be realized. Here, such anisotropic deposition process which realizes the balanced effect of deposition and etching in one step is referred to as "balanced plasma process."

FIG. 5 shows a result of an experiment according to one embodiment. In the example of FIG. 5, a substrate on which a photoresist mask was formed was provided. Then, a pattern was formed in the mask as illustrated FIG. 5 ("INITIAL" in FIG. 5). Then, the mask pattern was cured by a plasma generated from Argon (Ar) gas by applying a direct current to an upper electrode in a chamber. Then, the anisotropic deposition of the embodiment was performed employing a process gas containing $CH_4$ and $N_2$ for 0 second ("EXAMPLE 1" in FIG. 5), 240 seconds ("EXAMPLE 2" in FIG. 5), and 480 seconds ("EXAMPLE 3" in FIG. 5). As clearly shown in FIG. 5, when the anisotropic deposition was not performed, the vertical section of the original rectangular mask pattern became trapezoidal as the top portion deformed ("EXAMPLE 1" in FIG. 4). On the other hand, when the anisotropic deposition of the embodiment was performed, the height of the mask was substantially increased as in the EXAMPLES 2 and 3. In addition, the LWR improves as a result of the anisotropic deposition process.

Factors Contributing to Anisotropic Deposition

Various factors contribute to the anisotropic deposition, such as partial pressure, sticking coefficient, and temperature of substrate, and charge density, i.e., density of ions, in a plasma chamber where the anisotropic deposition is performed.

Figure 6:
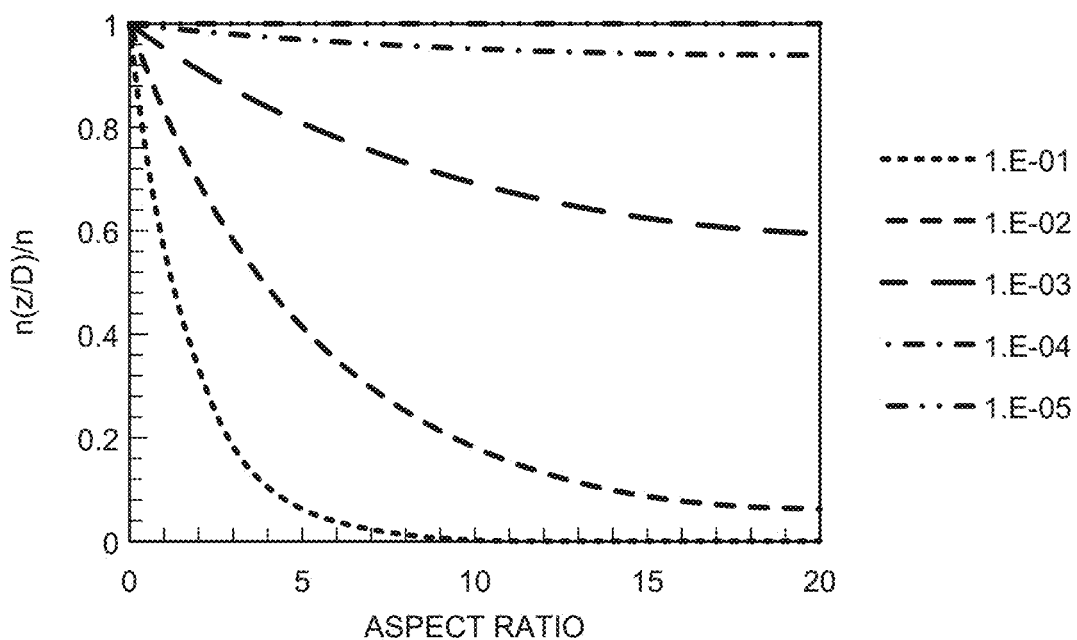
FIG. 6 illustrates a relation between sticking coefficient of gases with respect to a sidewall portion of a pattern to be treated and aspect ratio of the pattern.

FIG. 6 illustrates a relation between sticking coefficient of gases with respect to a sidewall portion of a pattern to be treated and aspect ratio or the pattern. As can be seen from FIG. 6, when the sticking coefficient is lower, more radicals are transported inside the hole. When the sticking coefficient is higher, radicals are not transported inside the hole, and the deposits may not be formed on the sidewall or on the bottom of the hole. By utilizing the difference in sticking coefficient, the amount of deposition on the sidewall portion of the pattern can be controlled. Hence, it may be preferable to use a gas with a high sticking coefficient such as $C_4F_6$, $SiCl_4$, and $CH_4$, and a gas with a low sticking coefficient such as $O_2$ and $N_2$ an combination an the anisotropic deposition.

Figure 7:
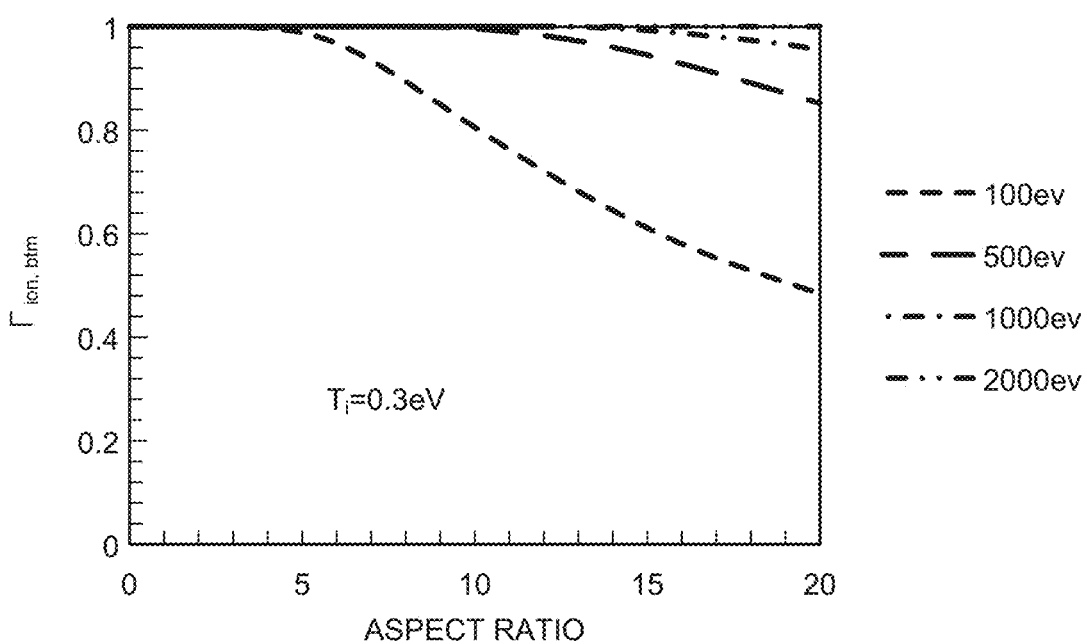
FIG. 7 illustrates a relation between ion density at a bottom portion of a pattern and aspect ratio.

FIG. 7 illustrates a relation between ion density at a bottom portion of a pattern and aspect ratio. When the ion density at the bottom portion of the pattern is low, the amount of deposits formed on the bottom portion decreases, in other words, there would be a more loading effect. As depicted in FIG. 7, when the energy (eV) of the generated plasma is lower, the ion density at the bottom portion is lower. Then, in order to exploit the loading effect, lower energy is preferable.

The amount of deposition may also be controlled based on the applied voltage. In addition, the amount of deposition may be controlled based on the temperature of an electrostatic chuck (ESC) on which the substrate is placed. The amount of deposition increases along with the decrease in the temperature of ESC. In addition, the ESC may be divided into more than one section, such that the temperature of each section can be controlled separately. Then, the amount of deposition may be controlled based on the temperature of each section of the ESC. This may increase the uniformity of the amount of deposition across the substrate placed on the ESC.

With the above factors taken into consideration, the process condition for the anisotropic deposition according to one embodiment may be set.

Mask Build-Up

Next, the effect of the mask build-up according to the embodiment will be described. As mentioned above, when the mask 103 is a photoresist mask formed through EUVL, the thickness of the mask 103 tends to be thin, for example, approximately 50 nm. Hence, if the etching is performed on the mask 103, the mask 103 may easily be etched away.

In the embodiment, to reduce the mask loss, the anisotropic deposition is performed for mask build-up. Then a further process may be performed.

Figure 8A:
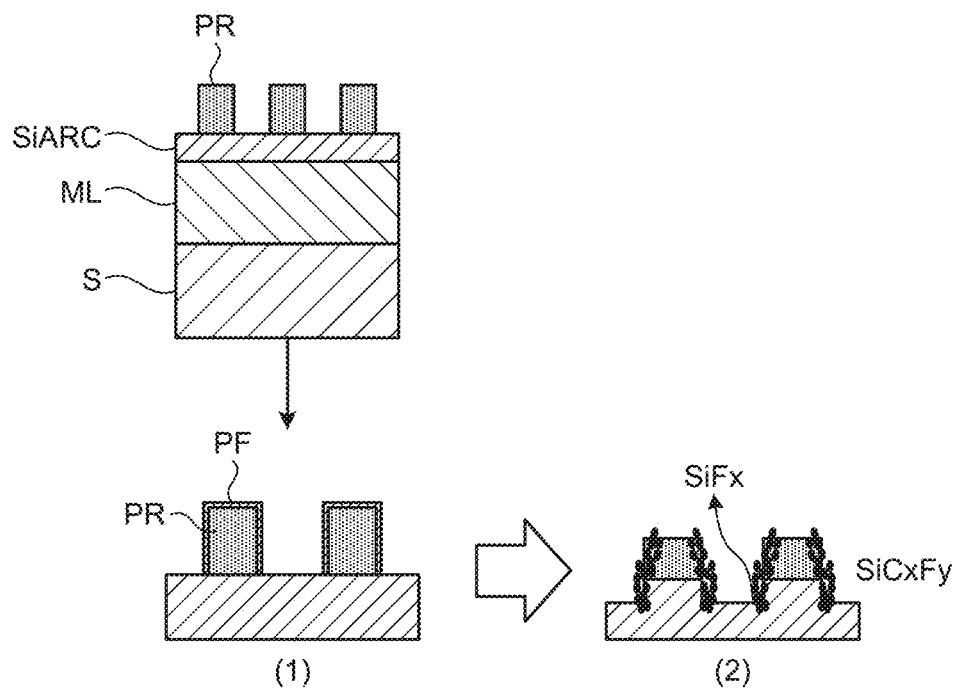
FIG. 8A is an illustration for explaining mask loss in a comparative example.
Figure 8B:
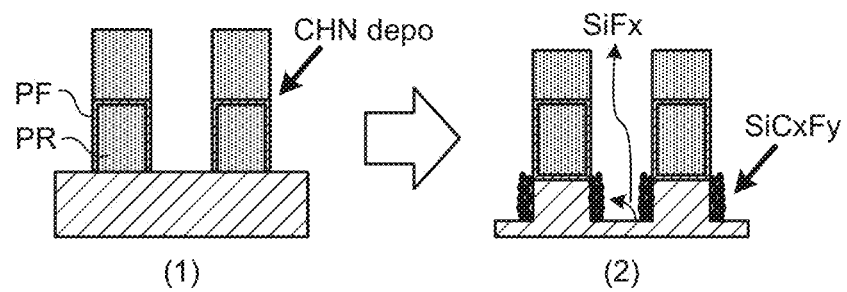
FIG. 8B is an illustration for explaining mask build-up by the anisotropic deposition of one embodiment.

FIG. 8A is an illustration for explaining mask loss in a comparative example. FIG. 8B is an illustration for explaining mask build-up by the anisotropic deposition of one embodiment.

On a sample substrate S of FIG. 8A, the underlying layer ML, antireflective coating (SiARC) and the photoresist mask PR were formed in this order. Further, a protective film PF was formed on the photoresist mask PR. In the example of FIG. 8A, a technique such as DOS was employed (FIG. 12A, (1)) to form the protective film PF. Then, a re-deposition process was performed.

Here, the re-deposition process includes a deposition step and a sputtering step. If a material to be sputtered in the subsequent sputtering step already exists on the pattern, the deposition step may be omitted. Firstly, in the deposition step, deposits are formed on the pattern through a deposition technique such as chemical vapor deposition (CVD). Then, in the sputtering step, accelerated ions of a process gas are made to bombard the pattern on the substrate. The process gas is, for example, a rare gas such as argon (Ar). The bombardment causes particles of the deposits in the pattern to be ejected from the pattern, and then to deposit on a nearby surface of the pattern again. Here, if the pattern includes a hole, the particles may escape from the hole if the hole is relatively large, whereas the particles may deposit on a sidewall of the hole if the hole is relatively small. The re-deposition may be utilized to achieve X>Y shrink, for example. Though the re-deposition is explained as one example, other techniques may be used for X-Y control.

As depicted in (2) of FIG. 8A, when the re-deposition process was performed on the sample substrate of (1) of FIG. 8A, the upper edge of the photoresist mask PR and a part of the antireflective coating (SiARC) were etched away, and the ideally rectangular section of the photoresist mask PR changed to a trapezoid.

FIG. 8B is an illustration for explaining mask build-up by the anisotropic deposition of one embodiment. Using a similar substrate as in FIG. 8A, firstly, as in the example of FIG. 8A, the DCS was employed to form the protective film PF. Then, from above the protective film PF, the anisotropic deposition of the embodiment was performed. The resulting pattern is shown in (1) of FIG. 8B. As is clear from (1) of FIG. 8B, the mask height was largely increased by the anisotropic deposition, and the original photoresist mask PR was well preserved. Thereafter, the re-deposition was performed under the same condition as FIG. 8A. Regardless of the re-deposition, the rectangular section of the photoresist mask PR was substantially unchanged, and the sputtered particles mainly deposited on the sidewall of antireflective coating (SiARC) ((2) of FIG. 8B). Thus, the shape of the photoresist mask PR was substantially maintained while the mask height was largely increased. Thus, according to one embodiment, even if the re-deposition process is performed many times in order to achieve a desired X-Y CD, the mask loss and deformation of the pattern may be prevented.

Enhanced Etching Selectivity

When the mask height is increased through the anisotropic deposition, the etching selectivity of the mask is also improved.

Figure 9:
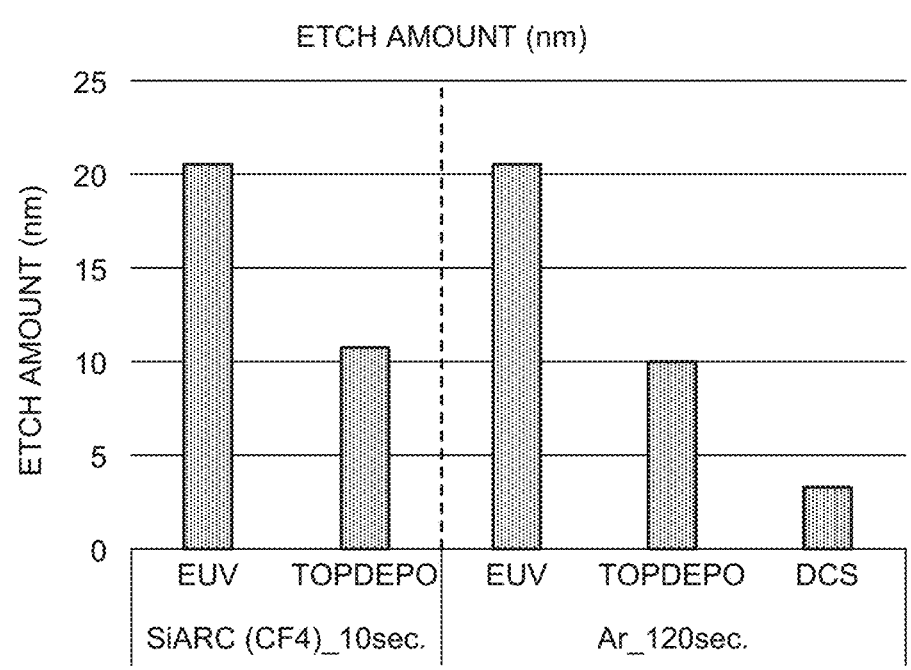
FIG. 9 illustrates an etching selectivity of a film formed by anisotropic deposition according to one embodiment.

FIG. 9 illustrates an etching selectivity of a film formed by the anisotropic deposition according to one embodiment. In FIG. 9, the etching selectivity of the mask formed by the anisotropic deposition ("TOPDEPO" in FIG. 9) is compared with the etching selectivity of the photoresist mask (see PR of FIG. 8A) formed through the EUV lithography ("EUV" in FIG. 9) and the film (see PF of FIG. 8A) formed by the DOS ("DCS" in FIG. 9). When the etching was performed using $CF_4$ for 10 seconds on the photoresist mask PR, approximately 20 nm of the photoresist mask PR was removed. On the other hand, the amount removed from the mask formed by the anisotropic deposition of the embodiment was approximately 10 nm. Thus, the mask formed by the anisotropic deposition of the embodiment had a higher etching selectivity than the EUV photoresist mask PR without any specific treatment. In addition, when Argon gas was used in place of $CF_4$ for etching for 120 seconds, the result was approximately the same.

Thus, when the anisotropic deposition of one embodiment is performed, the CD of the pattern can be maintained, while the mask height and the mask quality (etching selectivity) are enhanced.

X-Y CD Control

Figures 10A, 10B:
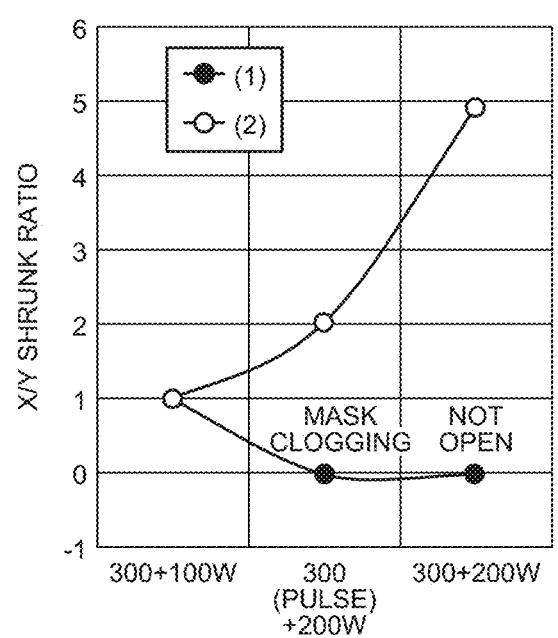
FIG. 10A shows examples of resulting patterns obtained through comparative processes and exemplary processes according to one embodiment.
FIG. 10B is a graph of the results obtained by the experiment of FIG. 10A

FIG. 10A shows examples of resulting patterns obtained through comparative processes and exemplary processes according to one embodiment. FIG. 10B is a graph of the results obtained by the experiment of FIG. 10A.

In an example (1) of FIG. 10A, the pattern (see "INITIAL") was subjected to the DCS and the re-deposition process for X-Y CD control. As can be seen from FIG. 10A, the oval patterns were thinned as a result of re-deposition. When the applied voltage was 200 (pulse)+200 W, the mask pattern was clogged, and when the applied voltage was 3300+200 W, the holes disappeared (mask break).

On the other hand, in an example (2) of FIG. 10A, the pattern was subjected to the anisotropic deposition of one embodiment, and then the re-deposition process for X-Y CD control. As can be seen in (2) of FIG. 10A, the oval holes kept their shapes regardless of the values of the applied voltages. In addition, the CD was maintained and the X/Y ratio was well controlled.

As illustrated in FIG. 10B, the mask clogging and mask break occurred in comparative example (1). When the anisotropic deposition of the embodiment was employed with the same process condition (voltages applied to the electrode in the chamber), the ΔX/ΔY ratio was much higher than in the comparative example, while the CD was relatively intact. Thus, it is confirmed that the anisotropic deposition of the embodiment serves to improve the X-Y CD controllability.

Here, the X-Y CD control means control of the critical dimension of the pattern in two orthogonal directions, X-direction and Y-direction. For example, when a pattern including a plurality of holes with an oval horizontal section are formed, one axis of the oval, e.g., an axis in X-direction may be shorter than another axis, e.g., an axis in Y-direction. The control to reduce the size of the pattern in Y-direction than in X-direction is referred to as "X<Y shrink" or "X<Y control"; the control to reduce the size of the pattern in X-direction than in Y-direction, "X>Y shrink" or "X>Y control"; and the control to reduce the size of the pattern both in X-direction and in Y-direction approximately by the same amount, "X=Y shrink" or "X=Y control".

LCDU Improvement

Figure 11:
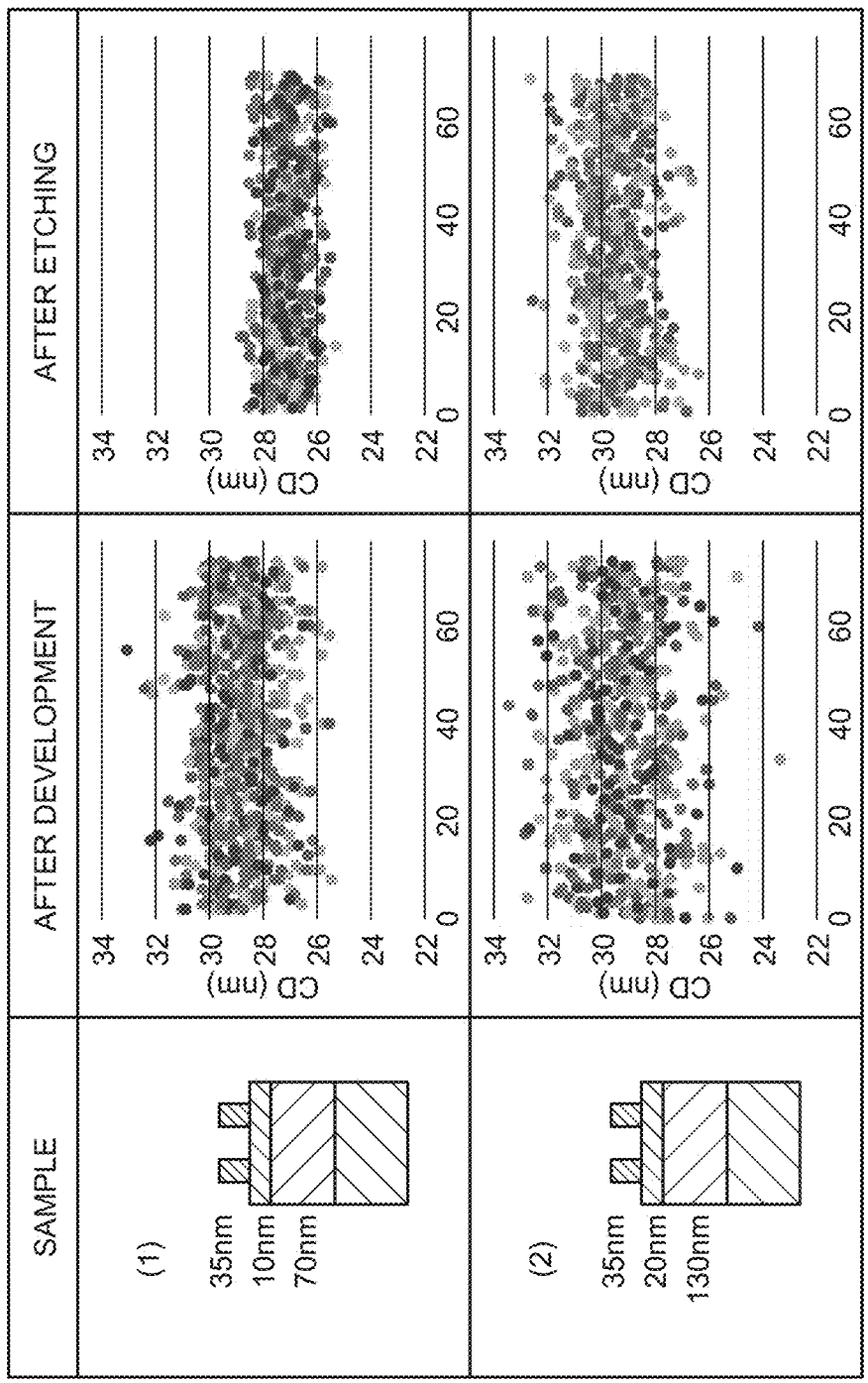
FIG. 11 shows an effect of LCDU improvement obtained through one exemplary process according to one embodiment.

The inventors confirmed that when the balanced plasma process was performed on the EUV mask, the LCDU was improved. FIG. 11 shows an effect of LCDU improvement obtained through one exemplary process according to one embodiment.

In an example (1) of FIG. 11, a spin-on-carbon (SOC) layer of 70 nm thickness was formed on a silicon (Si) substrate. Then, a SiARC film of 10 nm thickness was formed on the SOC layer. On the SiARC film, a 35 nm-thick EUV mask was formed. When the LCDU (3σ) and the CD was examined after the development, it turned out that the CD was 28.87 nm and the LCDU was 3.59. After the balanced plasma process and subsequent etching, it turned out that the CD was 27.05 nm while the LCDU was 2.01. Thus, the LCDU was improved without a major CD shrinkage. In an example (2) of FIG. 11, the thicknesses of the SOC layer and the SiARC film were changed respectively to 130 nm and 20 nm. In the initial state after the development, the CD was 25.33 nm and the LCDU was 4.35. After the balanced plasma process and subsequent etching, the CD was 25.45 nm and the LCDU was 2.97. Thus, in both samples, the LCDU was improved without a major CD shrinkage.

Direct Current Superposition (DCS)

Figure 12:
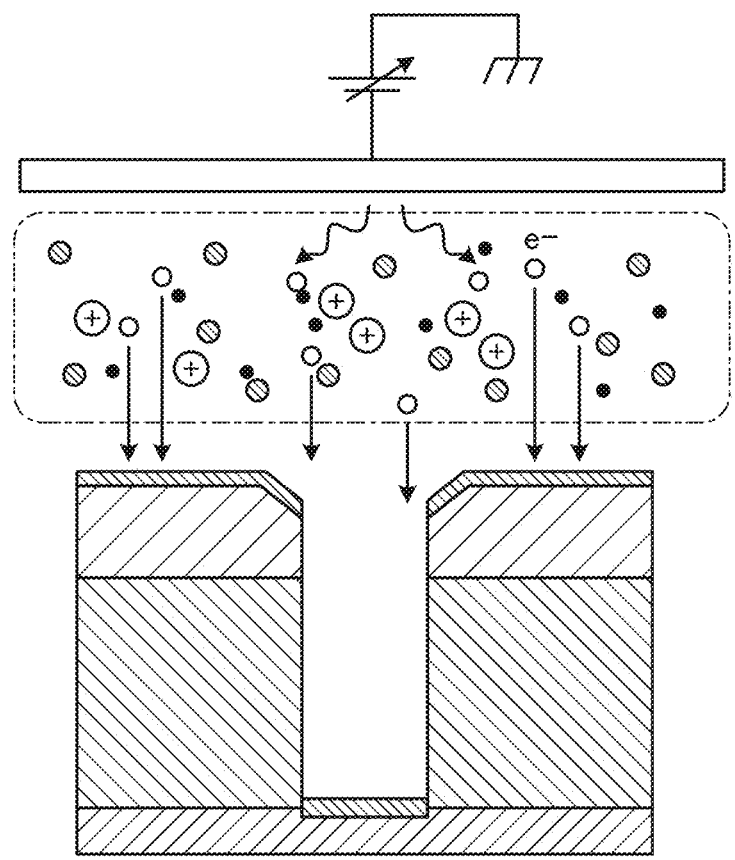
FIG. 12 is a diagram for explaining a mechanism of DCS.

The protective film 200 (see step S102 of FIG. 1 and FIG. 2B) may be formed using DCS. FIG. 12 is a diagram for explaining a mechanism of DCS, DCS is a technique to process a substrate by applying a negative direct current voltage to an upper electrode in a plasma chamber, thereby causing material, such as silicon, contained in the upper electrode to fall on the substrate placed below the upper electrode. DCS can be performed according to the technique described in United States Patent Application 2018/0151333, for example.

DCS can be used to form a film on a wafer DCS can also be used to cure the mask 103, for example, using a process gas of $H_2/N_2$. In the present embodiment, DCS is employed to form the protective film 200 on the mask 103. For the deposition of the protective film 200, a target may be further arranged above the substrate.

Exemplary Apparatus

To achieve the anisotropic deposition of the embodiment, a plasma processing apparatus performing the anisotropic deposition preferably includes a mechanism to generate a voltage from an upper structure, i.e., upper electrode. When the radio-frequency voltage for plasma generation is applied from the lower structure, the deposits tend to be transported to the bottom portion of the pattern. Hence, to achieve the anisotropic deposition of the embodiment, the apparatus such as an inductively-coupled plasma (ICP) apparatus, capacitively-coupled plasma (CCP) apparatus, and the like are preferable.

Figure 13:
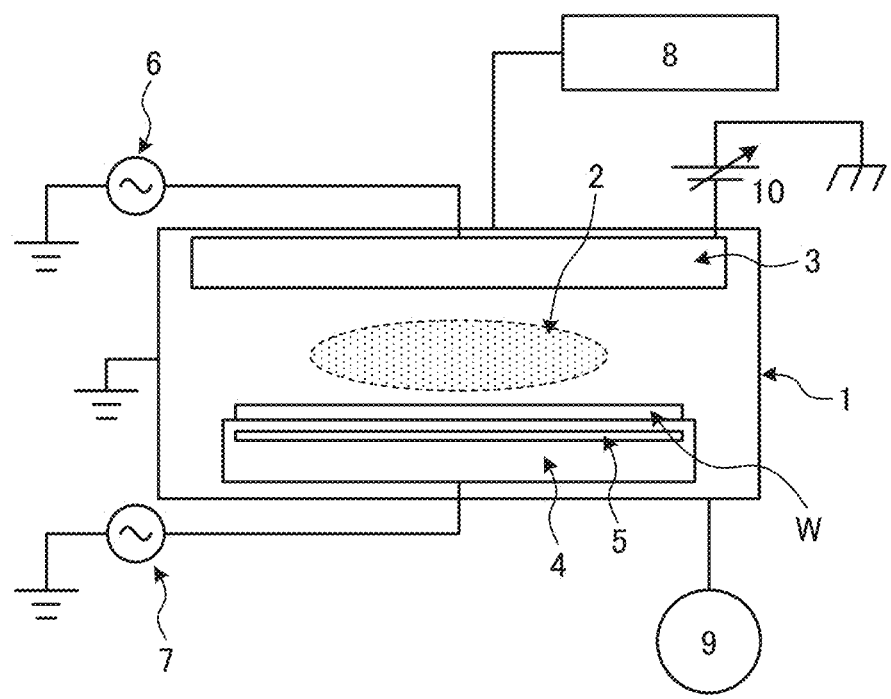
FIG. 13 illustrates a schematic structure of a capacitively-coupled plasma (CCP) type plasma system.

FIG. 13 illustrates a capacitively coupled plasma (CCP) type plasma system. The system of FIG. 13 includes a chamber 1, an upper electrode 3, and a lower electrode 4. RF power is coupled to the upper electrode 3 and the lower electrode 4 from RF sources 6, 7. The power coupling may include differing RF frequencies 6, 7. The lower electrode 4 includes an electrostatic chuck (ESC) 5 to support and retain a substrate W. A gas source 8 is connected to the chamber 1 to supply process gases into the chamber 1. An exhaust device 9 such as a turbo molecular pump (TMP) is connected to the chamber 1 to evacuate the chamber 1. Plasma 2 is formed proximate the substrate W between the upper electrode 3 and the lower electrode 4 as the RF power is supplied to at least one of the upper electrode 3 and the lower electrode 4. Alternatively, multiple RF power sources 6, 7 may be coupled to the same electrode. Moreover, variable direct current (DC) power source 10 may be coupled to the upper electrode 3.

Figure 14:
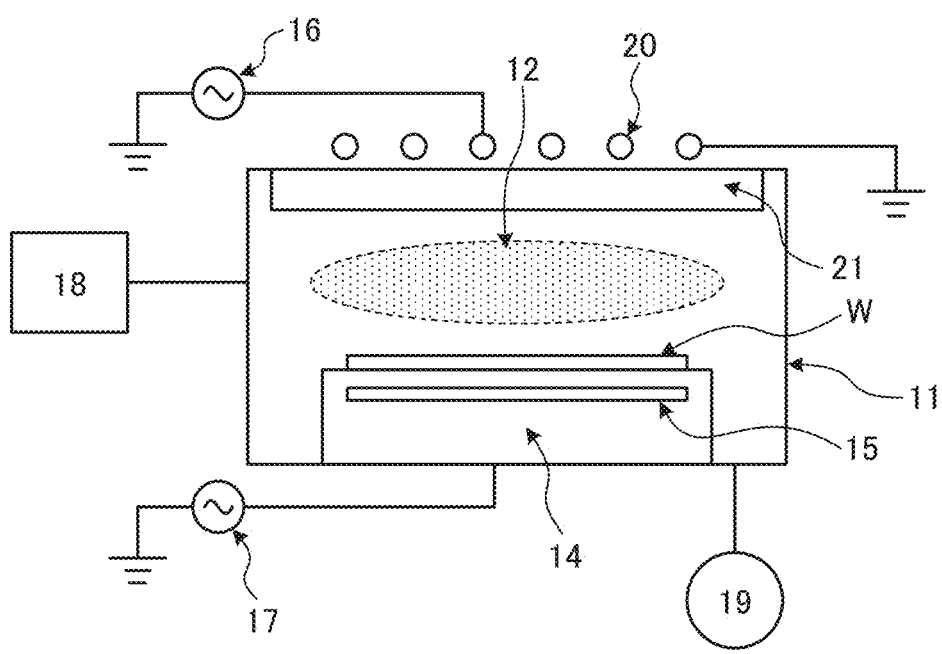
FIG. 14 illustrates an inductively coupled plasma (ICP) type plasma system.

FIG. 14 illustrates an inductively coupled plasma (ICP) type plasma system. FIG. 14 illustrates an inductively coupled plasma (ICP) type plasma system. The system includes a chamber 11, a dielectric window 21, and a lower electrode 14. An inductive element (coil) 20 is disposed above the dielectric window 21. RF power is coupled to the inductive element 20 and the lower electrode 14 from RF sources 16, 17. The power coupling may include differing RF frequencies 16, 17. The lower electrode 14 includes an electrostatic chuck (ESC) 15 to support and retain a substrate W. A gas source 18 is connected to the chamber 11 to supply process gases into the chamber 11. An exhaust device 19 such as a turbo molecular pump (TMP) is connected to the chamber 11 to evacuate the chamber 11. Plasma 12 is formed proximate the substrate W between the dielectric window 21 and the lower electrode 14 as the RF power is supplied to at least one of the dielectric window 21 and the lower electrode 14.

The balanced plasma process may be performed before the protective film 200 is formed for X-Y CD control.

Although the invention has bees described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method for processing a substrate in a plasma chamber, comprising:
providing a substrate on which an underlying layer to be etched and a mask are formed;
forming a protective film on the mask;
performing an anisotropic deposition to selectively form a deposition layer, separate from the protective film, on a portion of the protective film that is on a top portion of the mask, the performing the anisotropic deposition includes performing a balanced plasma process by exposing the substrate at a same time with a plasma generated from a process gas containing $C_xH_y$, and at least one of $N_2$ and $O_2$, the anisotropic deposition includes a combination of depositing of the deposition layer and etching of the deposition layer, and
etching the underlying layer after the performing the anisotropic deposition, wherein
separate etching of the underlying layer is not performed as an intermediate process step between the forming protective film and the performing the anisotropic deposition.

2. The method according to claim 1, wherein
the forming forms the protective film containing silicon by applying a direct current to an upper electrode of the plasma chamber to cause sputtering of a target arranged above the substrate, or by performing at least one of an atomic layer deposition (ALD), physical vapor deposition (PVD) and chemical vapor deposition (CVD).

3. The method according to claim 1, wherein
the forming forms the protective film with a thickness of at least one atomic layer.

4. The method according to claim 1, wherein
the providing provides the substrate on which the mask of an organic material is formed; and the forming forms the protective film of an inorganic material or metal.

5. The method according to claim 1, wherein
the providing provides the substrate on which the mask containing a metal is formed.

6. The method according to claim 1, wherein
the providing provides the substrate on which the mask containing Tungsten (W) or Titanium (Ti) is formed.

7. The method according to claim 1, further comprising:
after the anisotropic deposition, adjusting a dimension of a pattern on the substrate by sequentially exposing the substrate with a plasma generated from a first gas causing deposition and a plasma generated from a second gas causing at least one of sputtering and etching.

8. The method according to claim 7, wherein
the first gas contains Si, $C_xH_yF_z$, and $N_2$ or $O_2$, and
the second gas contains at least one of He, Ne, Ar, Kr, Xe, and $N_2$.

9. The method according to claim 7, wherein
the first gas contains Si, $C_xH_yF_z$, and $N_2$ or $O_2$, and
the second gas contains $C_xF_yH_z$.

10. The method according to claim 1, wherein
after the performing the anisotropic deposition, the etching the underlying layer includes etching from above the mask.

11. The method according to claim 10, wherein
the anisotropic deposition and the etching are performed in the same plasma chamber or in a same system.

12. A method for processing a substrate in a plasma chamber, comprising:
providing a substrate on which an underlying layer to be etched and a mask are formed;
forming a protective film on the mask;
exposing the substrate with a plasma generated from a process gas containing $C_xH_yF_z$ and at least one of $N_2$ and $O_2$, where (i) x is a natural number not less than one, y is a natural number not less than one, and z is zero or a natural number not less than one, or (ii) x is a natural number not less than one, y is zero or a natural number not less than one, and z is a natural number not less than one, and at least one of $N_2$ and $O_2$ by a predetermined rate, the exposing includes performing an anisotropic deposition to selectively form a deposition layer, separate from the protective film, on a portion of the protective film that is on a top portion of the mask, the performing includes performing a balanced plasma process by exposing the substrate at a same time with the plasma generated from the process gas, wherein
the anisotropic deposition includes a combination of depositing of the deposition layer and etching of the deposition layer,
the predetermined rate is determined such that resulting etching is substantially offset by resulting deposition during the performing the anisotropic deposition, and
separate etching of the underlying layer is not performed as an intermediate process step between the forming the protective film and the performing the anisotropic deposition.

13. A method for processing a substrate in a plasma chamber, comprising:
providing a substrate on which an underlying layer to be etched and a mask are formed;
exposing the substrate to a plasma generated from a process gas containing $C_xH_yF_z$ and at least one of N2 and O2, where (i) x is a natural number not less than one, y is a natural number not less than one, and z is zero or a natural number not less than one, or (ii) x is a natural number not less than one, y is zero or a natural number not less than one, and z is a natural number not less than one;

forming a protective film on a top and a sidewall of the mask; and performing an anisotropic deposition to selectively form a deposition layer, separate from the protective film, on a portion of the protective film that is on a top portion of the mask, the performing includes performing a balanced plasma process by exposing the substrate at a same time with the plasma generated from the process gas, and without a separate etching of the underlying layer between the forming and performing the balanced plasma process, the anisotropic deposition includes a combination of depositing of the deposition layer and etching of the deposition layer.

14. The method according to claim 13, further comprising:

after the anisotropic deposition, adjusting a dimension of a pattern on the substrate.

\* \* \* \* \*